(12) United States Patent
Chou et al.

(10) Patent No.: US 10,505,076 B2
(45) Date of Patent: *Dec. 10, 2019

(54) LIGHT-EMITTING DEVICE

(71) Applicant: EPISTAR CORPORATION, Hsinchu (TW)

(72) Inventors: Chien-Hua Chou, Hsinchu (TW);
Tai-Chun Wang, Hsinchu (TW);
Chih-Tsung Su, Hsinchu (TW);
Biau-Dar Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/231,827

(22) Filed: Dec. 24, 2018

(65) Prior Publication Data
US 2019/0148595 A1    May 16, 2019

Related U.S. Application Data

(63) Continuation of application No. 15/332,711, filed on Oct. 24, 2016, now Pat. No. 10,199,542, which is a continuation-in-part of application No. 14/977,686, filed on Dec. 22, 2015, now Pat. No. 9,530,934.

(51) Int. Cl.
*H01L 33/38* (2010.01)
*H01L 33/14* (2010.01)

(52) U.S. Cl.
CPC ............ *H01L 33/38* (2013.01); *H01L 33/145* (2013.01)

(58) Field of Classification Search
CPC .............................. H01L 33/38; H01L 33/145
See application file for complete search history.

(56) References Cited

U.S. PATENT DOCUMENTS

| | | | |
|---|---|---|---|
| 7,358,544 B2 | 4/2008 | Sakamoto et al. | |
| 7,511,311 B2 | 3/2009 | Kususe et al. | |
| 8,399,944 B2 | 3/2013 | Kwak et al. | |
| 8,742,438 B2 | 6/2014 | Kususe et al. | |
| 8,872,204 B2 | 10/2014 | Yang et al. | |
| 8,987,772 B2 | 3/2015 | Kim et al. | |
| 9,070,834 B2 | 6/2015 | Kim et al. | |
| 10,199,542 B2 * | 2/2019 | Chou | ...................... H01L 33/38 |
| 2012/0168801 A1 | 7/2012 | Xuan et al. | |

FOREIGN PATENT DOCUMENTS

| | | |
|---|---|---|
| CN | 1938869 A | 3/2007 |
| CN | 103222074 A | 7/2013 |

* cited by examiner

*Primary Examiner* — Thomas L Dickey
(74) *Attorney, Agent, or Firm* — Ditthavong & Steiner, P.C.

(57) ABSTRACT

A light-emitting device comprises a semiconductor stack; a pad electrode comprising a periphery disposed on the semiconductor stack; and a finger electrode connected to the pad electrode, wherein the finger electrode comprises a first portion extended from the periphery of the pad electrode and a second portion away from the pad electrode, the first portion comprises a first side and a second side, the first side is opposite to the second side, the first side comprises a first arc having a first curvature radius, and the first curvature radius is larger than 10 μm.

20 Claims, 5 Drawing Sheets

LIGHT-EMITTING DEVICE

REFERENCE TO RELATED APPLICATION

This application is a continuation application of U.S. patent application Ser. No. 15/332,711, filed on Oct. 24, 2016, which is a continuation-in-part application of U.S. patent application Ser. No. 14/977,686, filed on Dec. 22, 2015, now pending, and the content of which is hereby incorporated by reference in its entirety.

TECHNICAL FIELD

The application relates to a structure of a light-emitting device, and more particularly, to a light-emitting device comprising a pad electrode and a finger electrode extended from the pad electrode.

DESCRIPTION OF BACKGROUND ART

Light-emitting diode (LED) is widely used as a solid-state lighting source. Light-emitting diode (LED) generally includes a p-type semiconductor layer, an n-type semiconductor layer, and an active layer between the p-type semiconductor layer and the n-type semiconductor layer for emitting light. The principle of LED is to transform electrical energy to optical energy by applying electrical current to LED and injecting electrons and holes to the active layer. The combination of electrons and holes in the active layer emits light accordingly.

SUMMARY OF THE APPLICATION

A light-emitting device includes a semiconductor stack; a pad electrode comprising a periphery disposed on the semiconductor stack; and a finger electrode connected to the pad electrode, wherein the finger electrode includes a first portion extended from the periphery of the pad electrode and a second portion away from the pad electrode, the first portion includes a first side and a second side, the first side is opposite to the second side, the first side includes a first arc having a first curvature radius, and the first curvature radius is larger than 10 μm.

A light-emitting device comprises a first semiconductor layer; a first pad electrode comprising a periphery disposed on the first semiconductor layer; a first finger electrode connected to the first pad electrode, wherein the first finger electrode comprises a first portion extended from the periphery of the first pad electrode and a second portion connected to the first portion, the first portion comprises a width decreasing in a direction away from the periphery of the first pad electrode; and a first current blocking region comprising a periphery formed beyond the periphery of the first pad electrode, the periphery of the first current blocking region being formed under the first portion of the first finger electrode.

A light-emitting device comprises a first semiconductor layer; a second semiconductor layer; an active layer formed between the first semiconductor layer and the second semiconductor layer; a first pad electrode comprising a periphery disposed on the first semiconductor layer; and a first finger electrode connected to the first pad electrode, wherein the first finger electrode comprises a first portion extended from the periphery of the first pad electrode and a second portion connected to the first portion, the first portion comprises a first side and a second side opposite to the first side, the first side and/or the second side comprises a curvature radius, wherein a shortest distance between the first pad electrode and an edge of the second semiconductor layer is larger than a shortest distance between the first finger electrode and an edge of the second semiconductor layer.

A light-emitting device comprises a semiconductor stack; a pad electrode comprising a periphery disposed on the semiconductor stack; and a finger electrode connected to the pad electrode, wherein the finger electrode comprises a first portion extended from the periphery of the pad electrode and a second portion away from the pad electrode, one end of the first portion connecting to the periphery of the pad electrode comprises a width larger than another end of the first portion away from the periphery of the pad electrode, the first portion comprises a first side and a second side, the first side is opposite to the second side, the first side comprises a length between 0.5 μm and 30 μm.

DETAILED DESCRIPTION OF PREFERRED EMBODIMENTS

Figure 1A:
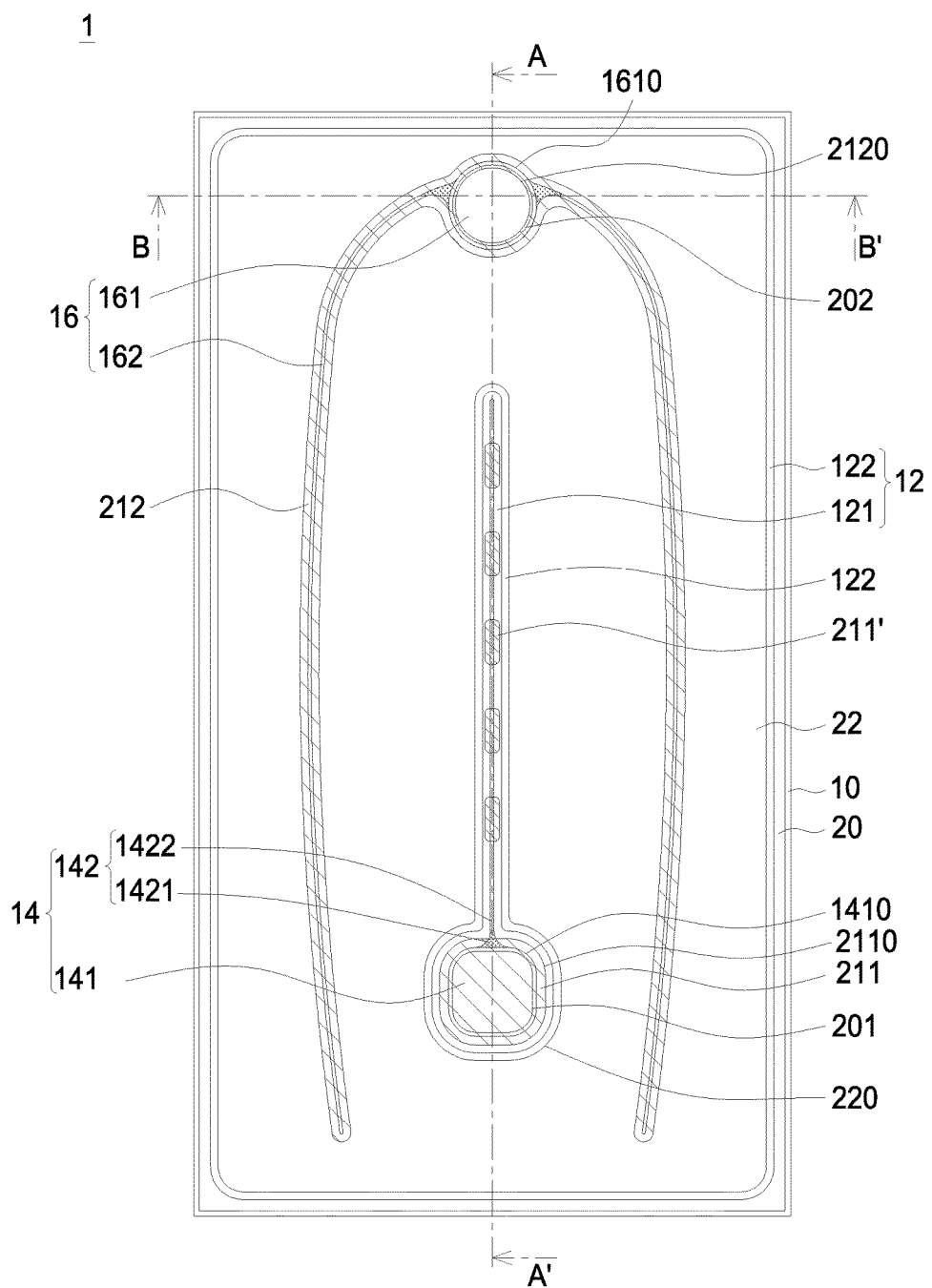
FIG. 1A shows a top view of a light-emitting device in accordance with an embodiment of the present application.

The embodiment of the application is illustrated in detail, and is plotted in the drawings. The same or the similar part is illustrated in the drawings and the specification with the same number.

Figure 1B:
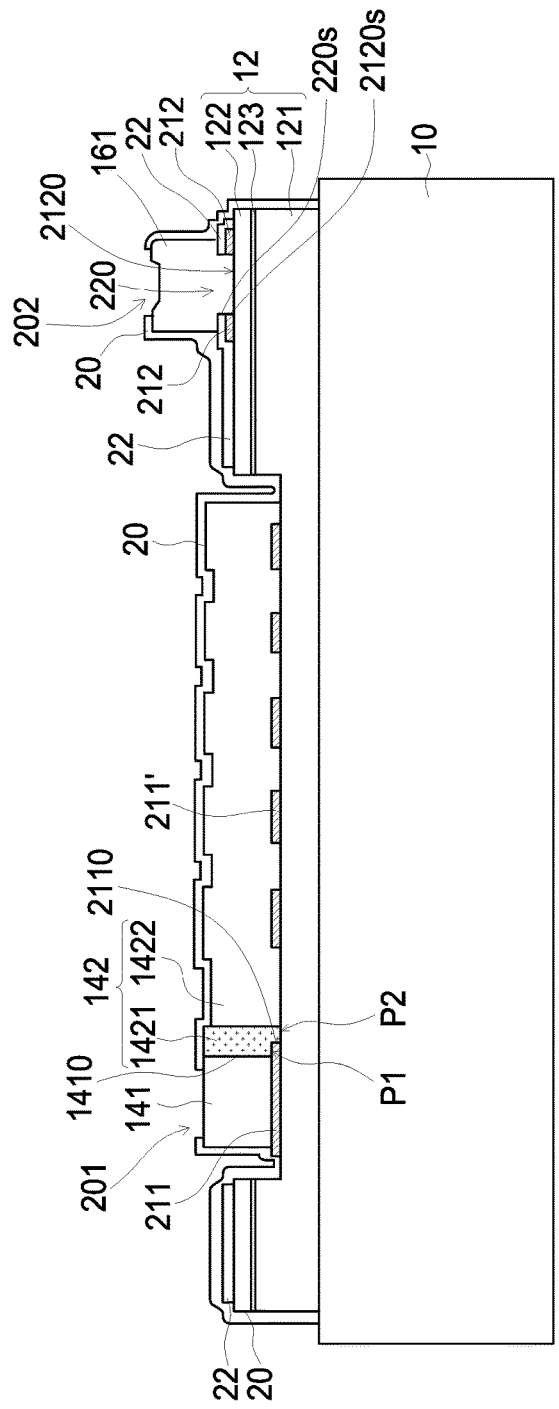
FIG. 1B shows a cross-sectional view of the light-emitting device along line A-A' of FIG. 1A.
Figure 1C:
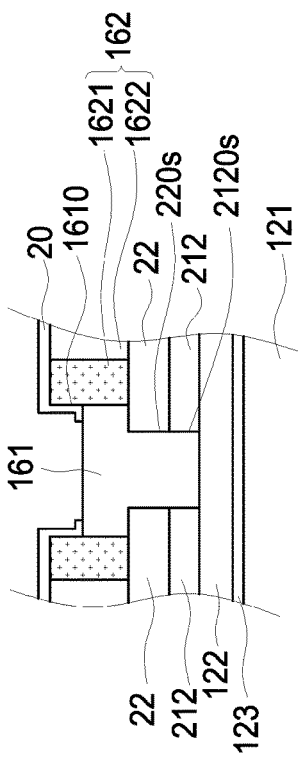
FIG. 1C shows a cross-sectional view of a portion of the light-emitting device along line B-B' of FIG. 1A.

FIG. 1A shows a structure diagram of a light-emitting device 1 in accordance with an embodiment of the present application. FIG. 1B shows a cross-sectional view of the light-emitting device 1 along line A-A' of FIG. 1A. FIG. 1C shows a cross-sectional view of a portion of the light-emitting device 1 along line B-B' of FIG. 1A. As shown in FIG. 1A, the light-emitting device 1 is a horizontal type light-emitting diode device comprising a substrate 10; a semiconductor stack 12 on the substrate 10; current blocking regions 211, 211', 212 on the semiconductor stack 12; a transparent conductive layer 22 on the semiconductor stack 12; a first electrode 14; a second electrode 16; and a protective layer 20 having openings 201, 202 to expose the first electrode 14 and the second electrode 16.

The first electrode 14 and the second electrode 16 can be on the same side of the substrate 10 or opposite sides of the substrate 10. FIGS. 1A-1C show an embodiment that the first electrode 14 and the second electrode 16 are on the same side of the substrate 10. As shown in FIG. 1B and FIG. 1C, the semiconductor stack 12 includes a first semiconductor layer 121, a second semiconductor layer 122, and an active layer 123 formed between the first semiconductor layer 121 and the second semiconductor layer 122. The first semiconductor layer 121 and the second semiconductor layer 122 include different conductivity types, electricity, polarity, or dopant elements for providing electrons and holes. Specifically, the first semiconductor layer 121 includes n-type or p-type semiconductor, and the second semiconductor layer 122 includes p-type semiconductor when the first semiconductor layer 121 is n-type semiconductor, or n-type semiconductor when the first semiconductor layer 121 is p-type semiconductor. The active layer 123 is formed between the first semiconductor layer 121 and the second semiconductor layer 122. The active layer 123 converts electrical energy to optical energy. The dominant wavelength of the light is adjusted by changing physical and chemical compositions of one or more layers in the semiconductor stack 12. The material of the semiconductor stack 12 includes aluminum gallium indium phosphide (AlGaInP), aluminum gallium indium nitride (AlGaInN). The active layer 123 includes single heterostructure (SH), double heterostructure (DH), double-side double heterostructure (DDH), or multi-quantum well (MQW) structure. Specifically, the active layer 123 includes i-type, p-type, or n-type semiconductor. The active layer 123 emits light when an electrical current passes through the semiconductor stack 12. When the active layer 123 includes AlGaInP based material, the active layer 123 emits amber series light, such as red light, orange light, or yellow light; when the active layer 123 includes AlGaInN based material, the active layer 123 emits blue green, or UV light. The present embodiment illustrates the semiconductor stack 12 with aluminum gallium indium nitride (AlGaInN) based material. These layers can be deposited by a variety methods, including MOVPE (metal organic vapor phase epitaxy), MBE (molecular beam epitaxy), or HVPE (hydride vapor phase epitaxy).

A surface of the first semiconductor layer 121 is exposed by etching a part of the semiconductor stack 12 and removing the second semiconductor layer 122 and the active layer 123. The first electrode 14 is disposed on the surface of the first semiconductor layer 121 and is formed in electrical connection with the first semiconductor layer 121. The second electrode 16 is disposed on the surface of the second semiconductor layer 122 and is formed in electrical connection with the second semiconductor layer 122.

The current blocking regions 211, 211' are formed on the first semiconductor layer 121, and the current blocking region 212 is formed on the second semiconductor layer 122 that avoid of the current supplied from the first electrode 14 and the second electrode 16 being crowded under the first electrode 14 and the second electrode 16. The material of the current blocking regions 211, 211', 212 comprises insulated material, such as silicon oxide, silicon nitride or aluminum oxide. The structure of the current blocking regions 211, 211', 212 can be single layer or alternately multiple layers, such as DBR (distributed bragg reflector).

The transparent conductive layer 22 is formed on the current blocking region 212 and/or the surface of the second semiconductor layer 122 that allows the current supplied from the first electrode 14 and the second electrode 16 to flow uniformly to the entire surface of the second semiconductor layer 122. Because the transparent conductive layer 22 is disposed on the light extraction side of the light-emitting device 1, an electrically-conducting material that has transparent property is preferable to be selected. More specifically, the transparent conductive layer 22 preferably includes an oxide containing at least one element selected from zinc, indium, or tin, such as ZnO, InO, SnO, ITO (indium tin oxide), IZO (indium zinc oxide), or GZO (gallium-doped zinc oxide). A thin metal film can also be used as the transparent conductive layer 22. The transparent conductive layer 22 preferably has high optical transmissivity (such as 60%, 70%, 75%, 80% or higher) of light emitted from the active layer 123, and is a material with relatively high electrical conductivity.

In an embodiment of the present application, the current blocking region 212 formed between the second electrode 16 and the semiconductor stack 12 includes an opening 2120 to expose the surface of the second semiconductor layer 122, the transparent conductive layer 22 overlaying the current blocking region 212 includes an opening 220 to expose the surface of the second semiconductor layer 122, and the opening 220 of the transparent conductive layer 22 includes a width same as a width of the opening 2120 of the current blocking region 212. In other words, the side surface 2120s of the current blocking region 212 and the side surface 220s of the transparent conductive layer 22 are substantially on a same plane as shown in FIG. 1B.

In another embodiment of the present application, the current blocking region 212 formed between the second electrode 16 and the semiconductor stack 12 includes an opening 2120 to expose the surface of the second semiconductor layer 122, the transparent conductive layer 22 overlaying the current blocking region 212 includes an opening 220 to expose the surface of the second semiconductor layer 122, and the opening 220 of the transparent conductive layer 22 includes a width larger than width of the opening 2120 of the current blocking region 212. In other words, the side surface 220s of the transparent conductive layer 22 is formed beyond the side surface 2120s of the current blocking region 212. The side surface 2120s of the current blocking region 212 includes a slope. An angle between the side surface 2120s and the surface of the second semiconductor layer 122 is an acute angle.

In another embodiment of the present application, the current blocking region 212 formed between the second electrode 16 and the semiconductor stack 12 includes an opening 2120 to expose the surface of the second semiconductor layer 122, the difference between this embodiment and above embodiments is the side surface 2120s of the current blocking region 212 includes two surface sections having different slopes from a cross-sectional view. The surface section near the surface of the second semiconductor layer 122 has a slope larger than that of the other one.

As shown in FIG. 1A, the light-emitting device 1 includes a rectangular shape including a longer side and a shorter side from a top view. The first electrode 14 includes a first pad electrode 141; and one or more first finger electrodes 142 extended from the first pad electrode 141 and towards the second pad electrode 161 along a direction parallel to the longer side of the light-emitting device 1. The second electrode 16 includes a second pad electrode 161; and one or more second finger electrodes 162 extended from the second pad electrode 161 and towards the first pad electrode 141 along a direction parallel to the longer side of the light-emitting device 1. The first electrode 14 and the second electrode 16 may be disposed to have a symmetrical structure based on at least one of a horizontal line, a vertical line, or a diagonal line traversing the center of the light emitting surface 1.

In an embodiment of the present application, as shown in FIG. 1A, a shortest distance between the first pad electrode 141 and an edge of the second semiconductor layer 122 is larger than a shortest distance between the first finger electrode 142 and an edge of the second semiconductor layer 122.

In another embodiment of the present application, a shortest distance between the first pad electrode 141 and an edge of the second semiconductor layer 122 is approximately same as a shortest distance between the first finger electrode 142 and an edge of the second semiconductor layer 122.

In another embodiment of the present application, the first electrode 14 can include a plurality of first pad electrodes 141; and one or more first finger electrodes 142 extended from each of the first pad electrodes 141. The second electrode 16 can include a plurality of second pad electrodes 161; and one or more second finger electrodes 162 extended from each of the second pad electrodes 161.

In another embodiment of the present application, the protective layer 20 covers the surface of the semiconductor stack 12, the first electrode 14 and the second electrode 16. The protective layer 20 includes openings 201, 202 respectively exposing part top surfaces of the first pad electrode 141 and the second pad electrode 161. The protective layer 20 includes insulated material, such as silicon oxide, silicon nitride, or aluminum oxide. The protective layer 20 can be a single layer structure or multi-layered structure. In another embodiment of the present application, the protective layer 20 includes openings 201, 202 respectively exposing entire of the first pad electrode 141 and the second pad electrode 161, and the protective layer 20 is spaced apart from the first pad electrode 141 and the second pad electrode 161 respectively.

In another embodiment of the present application, the light-emitting device 1 includes a rectangular shape comprising multiple sides having a longer side and a shorter side; and a corner formed by intersecting the longer side and the shorter side. The first pad electrode 141 is formed on a first corner and the second pad electrode 161 is formed on a second corner. The first corner and the second corner are formed on a diagonal line of the light-emitting device 1. The one or more first finger electrodes 142 are extended from the first pad electrode 141 and towards the second pad electrode 161 along a direction parallel to the longer side and/or the shorter side of the light-emitting device 1. The one or more second finger electrodes 162 are extended from the second pad electrode 161 and towards the first pad electrode 141 along a direction parallel to the longer side and/or the shorter side of the light-emitting device 1. Specifically, the second finger electrodes 162 are extended along the longer side and enclose the first electrode 14.

In an embodiment of the present application, each of the pad electrodes 141, 161 includes a dimension such as a width larger than that of the finger electrodes 142, 162, such that the pad electrodes 141, 161 can be connected to a conductive wire, solder bump or the like. The pad electrodes 141, 161 are disposed on opposing sides or corners of the light-emitting surface of the light-emitting device 1. The finger electrodes 142, 162 are extended from the pad electrodes 141, 161 to allow an injected current to be uniformly spread into the entirety of the light-emitting device 1.

In an embodiment of the present application, the pad electrodes 141, 161 and the finger electrodes 142, 162 are formed on the light-emitting surface at same step or different steps. The pad electrodes 141, 161 and/or the finger electrodes 142, 162 include a thickness ranging from 0.5 μm to 5 μm.

As shown in FIGS. 1A-1C, the first electrode 14 includes the first pad electrode 141; and the first finger electrode 142 extended from the first pad electrode 141. The first pad electrode 141 includes a periphery 1410, and the periphery 1410 includes a circular, an elliptical, or a rectangular shape from the top view of the light-emitting device 1. The second electrode 16 includes the second pad electrode 161; and the second finger electrodes 162 extended from the second pad electrode 161. The second pad electrode 161 includes a periphery 1610, and the periphery 1610 includes a circular, an elliptical, or a rectangular shape from the top view of the light-emitting device 1.

As shown in FIG. 1B, a plurality of current blocking regions 211' is discretely formed on the surface of the first semiconductor layer 121. The plurality of current blocking regions 211' and the current blocking regions 211 are discretely formed on the surface of the first semiconductor layer 121. The first pad electrode 141 and the first finger electrode 142 cover the current blocking regions 211 and the plurality of current blocking regions 211'. The current blocking region 211 is enclosed by a periphery 2110, the first pad electrode 141 is enclosed by a periphery 1410, and the periphery 1410 of the first pad electrode 141 is formed inside the periphery 2110 of the current blocking region 211. The first finger electrode 142 comprises a first portion 1421 extended from the periphery 1410 of the first pad electrode 141 and extended beyond the periphery 2110 of the current blocking region 211. In other words, the first portion 1421 of the first finger electrode 142 is formed on a region P1 of the current blocking region 211 and a region P2 of the first semiconductor layer 121. One part of the first portion 1421 formed on the region P1 of the current blocking region 211 comprises a larger surface area than that of another part of the first portion 1421 formed on the region P2 of the first semiconductor layer 121 from the top view of the light-emitting device 1 or the side view of the light-emitting device 1. A top surface of the first portion 1421 is totally covered by the protective layer 20. A top surface of the first pad electrode 141 is partially exposed by the opening 201 of the protective layer 20.

As shown in FIG. 1C, the opening 2120 of the current blocking region 212 is enclosed by the side surface 2120s of the current blocking region 212, the opening 220 of the transparent conductive layer 22 is enclosed by the side surface 220s of the transparent conductive layer 22, and the side surface 2120s of the current blocking region 212 and the side surface 220s of the transparent conductive layer 22 are substantially on a same plane. The second pad electrode 161 is enclosed by the periphery 1610, and the periphery 1610 is formed beyond the side surface 2120s of the current blocking region 212 and the side surface 220s of the transparent conductive layer 22. The second pad electrode 161 is formed in the opening 2120 of the current blocking region 212 and/or the opening 220 of the transparent conductive layer 22. The second finger electrode 162 comprises a first portion 1621 extended from the periphery 1610 of the second pad electrode 161 and formed above the current blocking region 212 and the transparent conductive layer 22. The first portion 1621 is formed beyond the opening 2120 of the current blocking region 212 and/or the opening 220 of the transparent conductive layer 22. A top surface of the first portion 1621 is totally covered by the protective layer 20. A top surface of the second pad electrode 161 is partially exposed by the opening 202 of the protective layer 20.

Figure 2:
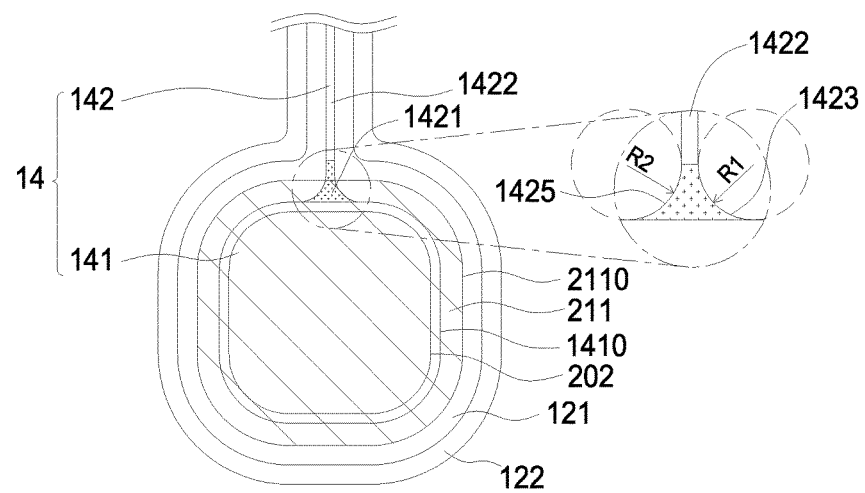
FIG. 2 shows an enlargement view of a portion of the light-emitting device of FIG. 1A in accordance with an embodiment of the present application.

FIG. 2 illustrates an enlargement view of a portion of the first electrode 14 of the light-emitting device 1 in accordance with an embodiment of the present application. In the embodiment, the periphery 1410 of the first pad electrode 141 includes the circular or the elliptical shape, the periphery 1410 of the first pad electrode 141 can be composed of a continuous curved line from a top view of the light-emitting device 1. When the periphery 1410 of the first pad electrode 141 includes the circular shape, the periphery 1410 of the pad electrode includes a single curvature having one curvature radius. When the periphery 1410 of the pad electrode includes the elliptical shape, the periphery 1410 of the pad electrode includes multiple curvature having different curvature radii.

In another embodiment of the present application, when the periphery 1410 includes the rectangular shape, a corner of the rectangular shape can be rounded as shown in FIG. 2. Specifically, when the periphery 1410 includes the rectangular shape, each corner of the periphery 1410 includes a curvature having one curvature radius, for example, the curvature radius can be between 0.5 µm and 30 µm, preferably between 1 µm and 20 µm. In other words, the periphery 1410 of the first pad electrode 141 can be composed of multiple curved lines and multiple straight lines from a top view of the light-emitting device 1. As shown in FIG. 2, one end of each curve line is connected to one of the straight lines, and another end of the curve line is connected to another one of the straight lines.

As shown in FIG. 2, the first portion 1421 of the first finger electrode 142 is extended from the periphery 1410 of the first pad electrode 141 and the second portion 1422 of the first finger electrode 142 is away from the first pad electrode 141, the first portion 1421 includes a first side 1423 and a second side 1425. The first portion 1421 includes a feature different from that of the second portion 1422. The feature includes material, shape, or size, such as width or thickness. For example, the first portion 1421 includes one end connected to the periphery 1410 of the first pad electrode 141, and another end away from the periphery 1410 of the first pad electrode 141. The one end connected to the periphery 1410 of the first pad electrode 141 includes a width or a thickness larger than that of the another end away from the periphery 1410 of the first pad electrode 141, wherein the width or the thickness of the first portion 1421 of the first finger electrode 142 gradually decreases from the one end connected to the periphery 1410 of the first pad electrode 141 towards the another end away from the periphery 1410 of the first pad electrode 141. One end of the second portion 1422 of the first finger electrode 142 connected to the first portion 1421 of the first finger electrode 142 includes a width substantially same as or different from that of another end of the second portion 1422 away from the first portion 1421 of the first finger electrode 142. The width of the one end of the first portion 1421 connected to the periphery 1410 is greater than that of the one end of the second portion 1422, and/or the another end of the second portion 1422. The width of the another end of the first portion 1421 away from the periphery 1410 is equal to or greater than that of the one end of the second portion 1422, and/or the another end of the second portion 1422.

In one embodiment of the present application, the first side 1423 of the first portion can be a straight line or a curved line and/or the second side 1425 of the first portion can be a straight line or a curved line. The straight line comprises a length between 0.5 µm and 30 µm, preferably between 5 µm and 15 µm, more preferably between 6 µm and 10 µm.

In one embodiment of the present application, the first side 1423 or the second side 1425 of the first portion 1421 is composed of one arc having one curvature radius, wherein one end of the one arc touches the periphery 1410 of the first pad electrode 141, and another end of the one arc touches the edge of the second portion 1422.

FIG. 2 shows an embodiment of the present application, the first side 1423 includes a first arc having a first curvature radius R1, the second side 1425 includes a second arc having a second curvature radius R2, and the first curvature radius R1 and the second curvature radius R2 are respectively larger than 10 µm. Preferably, the first curvature radius R1 and the second curvature radius R2 are respectively larger than 15 µm and smaller than 50 µm, more preferably larger than 15 µm and smaller than 30 µm. In an embodiment of the present application, the first curvature radius R1 can be same as the second curvature radius R2, or the first curvature radius R1 can be different from the second curvature radius R2.

In another embodiment of the present application, the first pad electrode 141 comprises a width between 10 µm and 60 the first side 1423 and/or the second side 1425 comprises a first curvature radius R1 larger than 10 µm.

In another embodiment of the present application, the first pad electrode 141 comprises a width between 60 µm and 140 the first side 1423 and/or the second side 1425 comprises a first curvature radius R1 larger than 15 µm.

The first curvature radius R1 or the second curvature radius R2 is defined by a radius of a virtual circle. Drawing a tangent line of the virtual circle to touch a point of the first side 1423 or the second side 1425, and the distance between the point and the center of the virtual circle is defined as the first curvature radius R1 or the second curvature radius R2.

In another embodiment of the present application, the first arc is a part section of a periphery of the virtual circle with the first curvature radius R1, and the second arc is a part section of a periphery of the virtual circle with the second curvature radius R2. In another embodiment of the present application, the first side 1423 only has a single one first arc with a single one first curvature radius R1, and the second side 1425 only has a single one second arc with a single one second curvature radius R2.

A sudden failure of the light-emitting device can be caused by electrostatic discharge (ESD) or Electrical Over Stress (EOS) due to electrical overload. The electrical overload, such as surge or high current injection, causing a local concentration of the current, is easily crowded at sharp corners of the electrodes in a conventional light emitting device. The current crowding is decrease the ESD tolerance and EOS endurance, and causing damage of the light emitting device, such as electrode metal migration or diffusion, and epitaxy breakdown. In the embodiments of the present application, the circular or elliptical shape of the pad electrodes or the curved corners of the rectangular shape of the pad electrodes allows the current supplied from the first electrode 14 and the second electrode 16 to flow uniformly to the entire surface of the semiconductor layers, and the ESD tolerance of the light-emitting device can be improved.

The curved shape of the first side and/or the second side of the first portion of the finger electrode improves the ESD tolerance and EOS endurance of the light-emitting device to avoid a local current crowding in the electrodes. In the manner, the electrostatic breakdown voltage (ESD tolerance) is increased in ESD test that is connecting a power with a light-emitting device in reverse series and applying a surge voltage (reverse voltage) to the light-emitting device.

The static electricity broken characteristic of the light-emitting device is a very important issue related to the application range of the light-emitting device. Specifically, a design of devices for withstanding a static electricity generated from package devices is a very important parameter for improving yield and reliability of a final device. Particularly, the static electricity characteristic has been become more important since the light-emitting device is recently used by being applied to a bad condition in environment such as an outdoor signboard and a vehicle light. Thus, an suitable electrode design of the light-emitting device is one way to improve the ESD tolerance. In an embodiment of the present application, when a static electricity is applied to the pad electrodes of the first electrode and the second electrode of the light-emitting device, a local current density may be over the carrier capability of the second portion of the finger electrode. The ESD tolerance of the finger electrodes of the light-emitting device depends on the size of the finger electrodes, such as the width or the area. The wider the finger electrode is, the better the ESD tolerance of the finger electrode is. However the metal material of the finger electrodes is absorptive for the light emitted from the light-emitting device. The wider the finger electrode is, the lower the light extraction efficiency is. The requirement for improving ESD tolerance and the requirement for improving light extraction efficiency are tradeoff. The present application proposes an electrode comprising a structure, such as the first portion of the finger electrode, having a cross sectional area between a cross sectional area of the pad electrode and the second portion of the finger electrode, and having a specific curvature radius to improve the ESD tolerance of the light-emitting device.

Figure 3:
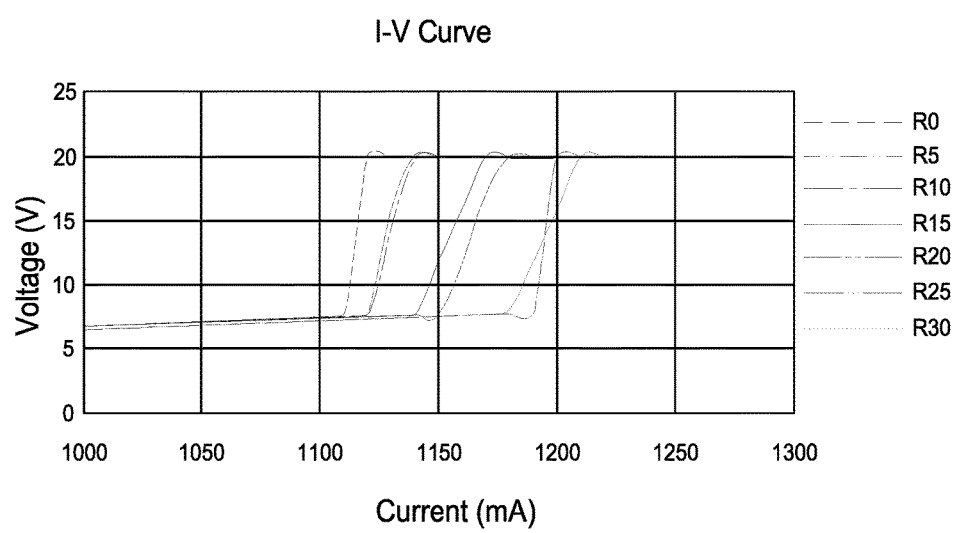
FIG. 3 shows an EOS testing diagram of the light-emitting devices having different curvature radii.

FIG. 3 illustrates an EOS (Electrical Over Stress) testing diagram of the light-emitting devices having different curvature radii. The light-emitting devices are tested under an injected current. When the injected current is increased beyond the endurance of the light-emitting device, the measured voltage abruptly increasing is observed, which means the light-emitting device is failed. As shown in FIG. 3, the larger curvature radius the light-emitting device has, the stronger endurance to EOS the light-emitting device has. The EOS endurance of the light-emitting device and the curvature radius have a positive correlation. For example, the light-emitting device having the curvature radius at 30 µm can afford a higher current from EOS testing than the light-emitting device having the curvature radius at 10 µm, so that the breakdown of the device can be avoided. A light-emitting device includes an electrode structure of the present application by which excellent current spreading effect may be achieved. A light-emitting device of the present application can minimize a loss of light, and provide a stronger endurance to EOS and a better ESD tolerance.

Figure 4:
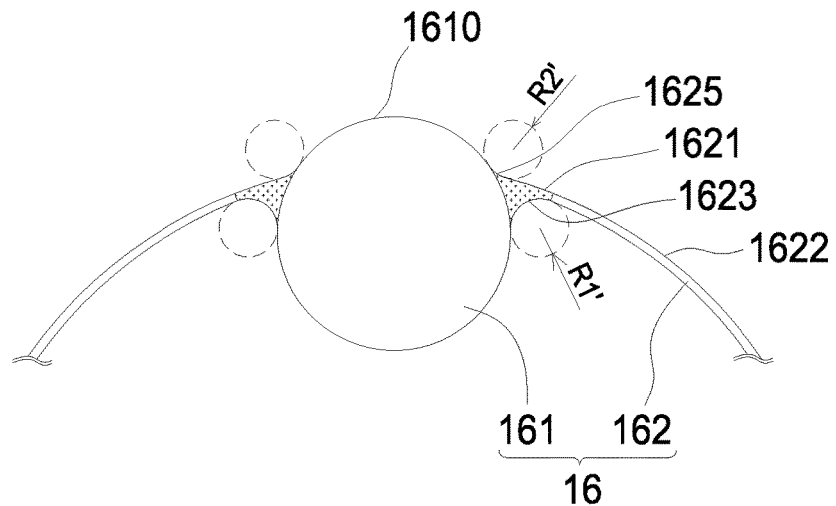
FIG. 4 shows an enlargement view of a portion of the light-emitting device of FIG. 1A in accordance with an embodiment of the present application.

FIG. 4 illustrates an enlargement view of a portion of the second electrode 16 of the light-emitting device 1 in accordance with an embodiment of the present application. As shown in FIG. 4, the second electrode 16 includes the second pad electrode 161; and one or a plurality of second finger electrodes 162 extended from the second pad electrode 161. The second pad electrode 161 includes a periphery 1610, and the periphery 1610 includes a circular, an elliptical, or a rectangular shape having a rounded corner. The second finger electrode 162 includes a first portion 1621 extended from the periphery 1610 of the second pad electrode 161 and a second portion 1622 away from the second pad electrode 161.

The first portion 1621 of the second finger electrode 162 includes a first side 1623 and a second side 1625. The first portion 1621 includes a feature different from that of the second portion 1622. The feature includes material, shape, or size, such as width or thickness. For example, the first portion 1621 includes one end connected to the periphery 1610 of the second pad electrode 161, and another end away from the periphery 1610 of the second pad electrode 161, the one end connected to the periphery 1610 of the second pad electrode 161 includes a width or a thickness larger than that of the another end away from the periphery 1610 of the second pad electrode 161. One end of the second portion 1622 of the second finger electrode 162 connected to the first portion 1621 of the second finger electrode 162 includes a width substantially same as that of another end of the second portion 1622 away from the first portion 1621 of the second finger electrode 162. The width of the one end of the first portion 1621 connected to the periphery 1610 is greater than that of the one end of the second portion 1622, and/or the another end of the second portion 1622. The width of the another end of the first portion 1621 away from the periphery 1610 is equal to or greater than that of the one end of the second portion 1622, and/or the another end of the second portion 1622.

In one embodiment of the present application, the first side 1623 of the first portion 1621 of the second finger electrode 162 can be a straight line or a curved line and/or the second side 1625 of the first portion 1621 of the second finger electrode 162 can be a straight line or a curved line.

In the embodiment of the present application, the first side 1623 includes a first arc having a first curvature radius R1', the second side 1625 includes a second arc having a second curvature radius R2', and the first curvature radius R1' or the second curvature radius R2' is larger than 10 µm. Preferably, the first curvature radius R1' or the second curvature radius R2' is larger than 15 µm and smaller than 50 µm, more preferably larger than 15 µm and smaller than 30 µm. In an embodiment of the present application, the first curvature radius R1' is same as the second curvature radius R2' or the first curvature radius R1' is different from the second curvature radius R2'. FIG. 4 illustrates an example that the first curvature radius R1' is larger than the second curvature radius R2'.

The first curvature radius R1' or the second curvature radius R2' is defined by a radius of a virtual circle. Drawing a tangent line of the virtual circle to touch a point of the first side 1623 or the second side 1625, and the distance between the point and the center of the virtual circle is defined as the first curvature radius R1' or the second curvature radius R2'.

In another embodiment of the present application, the first arc of the first side 1623 is a part section of a periphery of the virtual circle with the first curvature radius R1', and the second arc of the second side 1625 is a part section of a periphery of the virtual circle with the second curvature radius R2'. In another embodiment of the present application, the first side 1623 only has a single one first arc with a single one first curvature radius R1', and the second side 1625 only has a single one second arc with a single one second curvature radius R2'.

Figure 5:
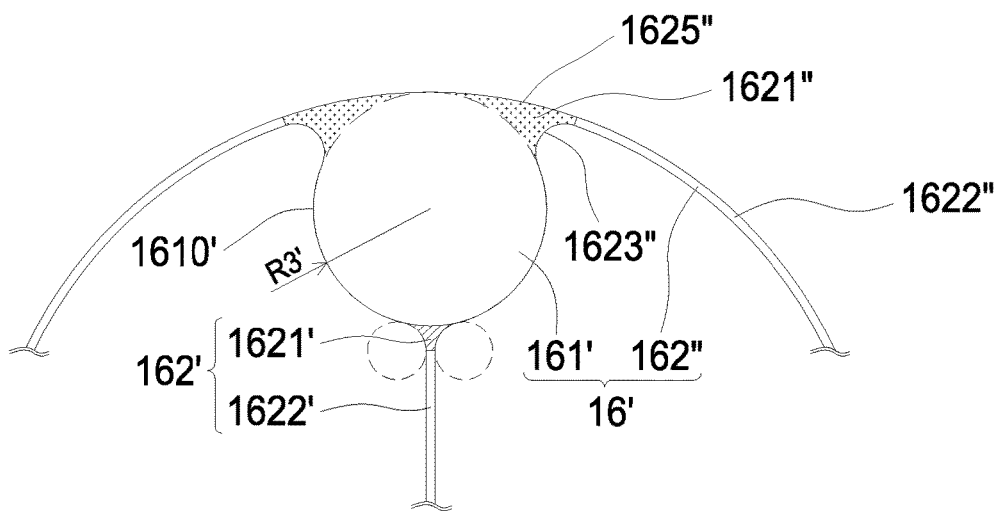
FIG. 5 shows an enlargement view of a portion of a light-emitting device in accordance with an embodiment of the present application.

FIG. 5 illustrates an enlargement view of a portion of an electrode 16' of a light-emitting device in accordance with another embodiment of the present application.

The electrode 16' can be disposed on the semiconductor layer, such as n-type semiconductor or p-type semiconductor, to allow an injected current flowing through the semiconductor layer. In the embodiment, the electrode 16' includes a pad electrode 161', and a plurality of finger electrodes 162', 162" extended from a periphery 1610' of the pad electrode 161', each of the plurality of finger electrodes 162', 162" comprises a first portion 1621', 1621" directly connected to the periphery 1610' of the pad electrode 161' and a second portion 1622', 1622" away from the periphery 1610' of the pad electrode 161'. The first portions 1621', 1621" of the finger electrodes 162', 162" comprise same or different curvature radii. For example, the first portion 1621' of the finger electrode 162' includes a curvature radius different from that of the first portion 1621" of the finger electrode 162" or same as that of the first portion 1621" of the finger electrode 162", wherein the finger electrode 162" is bent and towards away from the pad electrode 161', the second portion 1622' of the finger electrode 162' includes a straight line and towards away from the pad electrode 161'.

As shown in FIG. 5, the periphery 1610' of the pad electrode 161' includes a third curvature radius R3' larger than the curvature radius of the second side 1625" of the first portion 1621" of the finger electrode 162", the third curvature radius R3' is different from the curvature radius of the first side 1623" of the first portion 1621" of the finger electrode 162", for example, the third curvature radius R3' is larger than the curvature radius of the first side 1623" of the first portion 1621" of the finger electrode 162". A curvature center of the curvature radius of the second side 1625" of the first portion 1621" of the finger electrode 162" does not coincide with a curvature center of the third curvature R3' of the pad electrode 161'.

Figure 6:
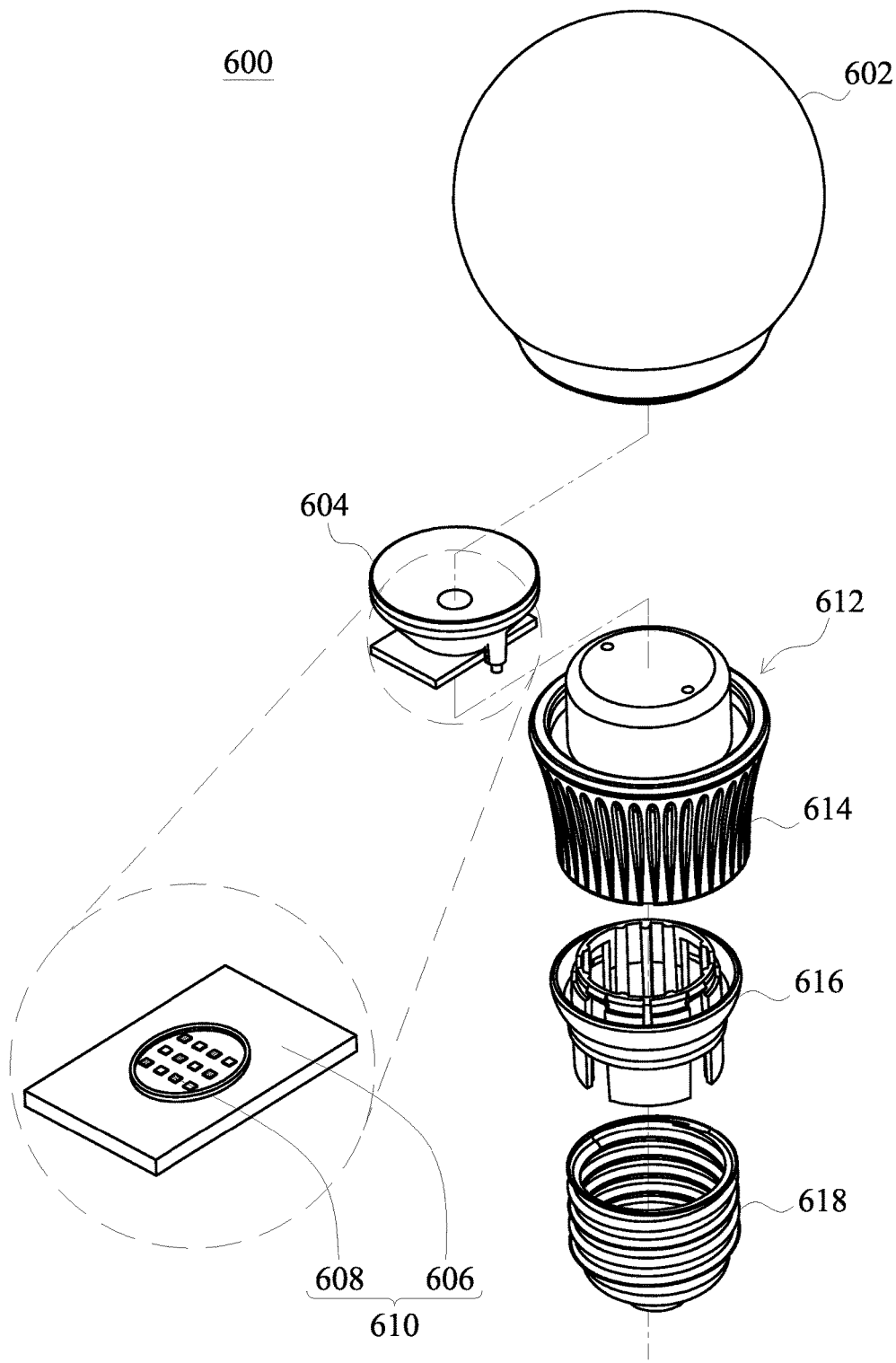
FIG. 6 shows a diagram of a light bulb in accordance with an embodiment of the present application.

FIG. 6 illustrates a structure diagram of a light bulb 600 in accordance with another embodiment of the present application. The light bulb 600 includes an envelope 602, a lens 604, a light-emitting module 610, a base 612, a heat sink 614, a connector 616 and an electrical connecting device 618. The light-emitting module 610 includes a submount 606 and one or a plurality of light-emitting devices 608 formed on the submount 606, wherein the one or the plurality of light-emitting devices 608 can be same as the light-emitting device 1 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a first semiconductor layer;
   a first pad electrode comprising a first periphery disposed on the first semiconductor layer;
   a first finger electrode connected to the first pad electrode, wherein the first finger electrode comprises a first portion extended from the first periphery of the first pad electrode and a second portion connected to the first portion, the first portion comprises a width decreasing in a direction away from the first periphery of the first pad electrode in a top view of the light-emitting device; and
   a first current blocking region formed under the first portion of the first finger electrode, comprising a periphery formed beyond the first periphery of the first pad electrode, wherein the first portion comprises one part formed on the first current blocking region and another part directly formed on the first semiconductor layer, and the one part comprises a surface area larger than a surface area of the another part in the top view of the light-emitting device.

2. The light-emitting device of claim 1, wherein the first portion of the first finger electrode comprises a first side and a second side opposite to the first side, the first side comprises a first arc comprising a first curvature radius larger than 10 µm or the second side comprises a second arc having a second curvature radius, and the second curvature radius is larger than 10 µm in the top view of the light-emitting device.

3. The light-emitting device of claim 2, wherein the first curvature radius and the second curvature radius are respectively larger than 15 µm.

4. The light-emitting device of claim 3, wherein the first curvature radius and the second curvature radius are respectively smaller than 30 µm.

5. The light-emitting device of claim 2, wherein the first curvature radius is same as the second curvature radius.

6. The light-emitting device of claim 2, wherein the first curvature radius is different from the second curvature radius.

7. The light-emitting device of claim 2, wherein the first side of the first portion of the first finger electrode is directly connected to the first periphery of the first pad electrode, the first periphery of the first pad electrode comprises a third curvature radius larger than the first curvature radius.

8. The light-emitting device of claim 2, wherein the first side of the first portion of the first finger electrode is directly connected to the first periphery of the first pad electrode, the first periphery of the first pad electrode comprises a third curvature radius different from the first curvature radius.

9. The light-emitting device of claim 1, further comprising:
   a second semiconductor layer;
   an active layer formed between the first semiconductor layer and the second semiconductor layer;
   a second pad electrode comprising a second periphery disposed on the second semiconductor layer; and
   a second finger electrode connected to the second pad electrode,
      wherein the second finger electrode comprises a third portion extended from the second periphery of the second pad electrode and a fourth portion connected to the third portion, the third portion comprises a width decreasing in a direction away from the second periphery of the second pad electrode in the top view of the light-emitting device; and
      a second current blocking region comprising a periphery formed beyond the second periphery of the second pad electrode, the periphery of the second current blocking region being formed under the third portion of the second finger electrode.

10. The light-emitting device of claim 1, further comprising a plurality of current blocking region discretely formed under the second portion of the first finger electrode, wherein the plurality of current blocking region is separated from the first current blocking region.

11. The light-emitting device of claim 1, wherein one end of the second portion of the first finger electrode connected to the first portion of the first finger electrode comprises a width substantially same as that of another end of the second portion away from the first portion of the first finger electrode.

12. A light-emitting device, comprising:
    a first semiconductor layer;
    a first pad electrode comprising a first periphery disposed on the first semiconductor layer; and
    a first finger electrode connected to the first pad electrode,
       wherein the first finger electrode comprises a first portion extended from the first periphery of the first pad electrode and a second portion connected to the first portion, the first portion comprises a width decreasing in a direction away from the first periphery of the first pad electrode, and
       wherein the first portion comprises a first side and a second side, the first side is opposite to the second side, the first side comprises a first arc comprising a first curvature radius, and the second side comprises a second arc comprising a second curvature radius.

13. The light-emitting device of claim 12, wherein the first curvature radius and/or the second curvature radius is larger than 10 μm.

14. The light-emitting device of claim 12, wherein the curvature radius and/or the second curvature radius is larger than 15 μm.

15. The light-emitting device of claim 12, wherein the first curvature radius of the first side is different from the second curvature radius of the second side.

16. A light-emitting device, comprising:
a first semiconductor layer;
a first pad electrode comprising a first periphery disposed on the first semiconductor layer; and
a first finger electrode connected to the first pad electrode, wherein the first finger electrode comprises a first portion extended from the first periphery of the first pad electrode and a second portion extended away from the first pad electrode, and
wherein the first portion comprises one end connecting to the first periphery of the first pad electrode and another end extending away from the first periphery of the first pad electrode, and the first portion comprises a thickness that gradually decreases from the one end towards the another end.

17. The light-emitting device of claim 16, wherein the one end of the first portion connecting to the first periphery of the first pad electrode comprises a width larger than the another end of the first portion extended away from the first periphery of the first pad electrode in a top view of the light-emitting device.

18. The light-emitting device of claim 16, wherein the first portion comprises a first side and a second side, the first side is opposite to the second side, and the first side comprises a length between 0.5 μm and 30 μm in the top view of the light-emitting device.

19. The light-emitting device of claim 18, wherein the first side or the second side is a straight line in the top view of the light-emitting device.

20. The light-emitting device of claim 16, wherein the first portion comprises a first side and a second side, the first side and the second side respectively comprises an arc having a curvature radius larger than 10 μm.

* * * * *